(12) United States Patent
Grasso et al.

(10) Patent No.: US 7,135,891 B2
(45) Date of Patent: Nov. 14, 2006

(54) CURRENT SENSE SHUNT RESISTOR CIRCUIT

(75) Inventors: Massimo Grasso, S. Martino S. (IT); Aldo Torti, San Carlo Canavese (IT); Andrea Merello, Arese (IT); Jonas Aleksandravicius, Vilnius (LT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/208,821

(22) Filed: Aug. 22, 2005

(65) Prior Publication Data
US 2006/0049854 A1   Mar. 9, 2006

Related U.S. Application Data

(62) Division of application No. 10/625,029, filed on Jul. 22, 2003, now abandoned.

(51) Int. Cl.
*H03K 5/22* (2006.01)
(52) U.S. Cl. .............................. 327/50; 327/51; 327/68; 327/77; 327/91
(58) Field of Classification Search .................... None
See application file for complete search history.

(56) References Cited

U.S. PATENT DOCUMENTS

| 5,231,315 | A | 7/1993 | Thelen, Jr. | 327/103 |
|---|---|---|---|---|
| 5,526,216 | A | 6/1996 | Konrad et al. | 361/101 |
| 6,268,770 | B1 * | 7/2001 | Barbetta | 330/264 |
| 6,316,983 | B1 | 11/2001 | Kitamura | 327/317 |
| 6,414,549 | B1 * | 7/2002 | Barbetta | 330/264 |
| 6,469,484 | B1 * | 10/2002 | L'Hermite et al. | 323/284 |
| 6,970,365 | B1 * | 11/2005 | Turchi | 363/81 |

* cited by examiner

*Primary Examiner*—Tuan T. Lam
*Assistant Examiner*—Hiep Nguyen
(74) *Attorney, Agent, or Firm*—Ostrolenk, Faber, Gerb & Soffen, LLP (57) ABSTRACT

Current through a wire is sensed with a shunt resistor and a sense resistor in a current divider circuit. The values of the shunt resistor and sense resistor are related to provide a specified gain ratio to increase a dynamic range of current measurement. The sense resistor is a trimmable resistor, the configuration of which can be discerned from a look-up table based on a level of precision needed for current measurement. The two resistors can also be related by thermal coefficients to improve linearity of current measurements.

19 Claims, 5 Drawing Sheets

CURRENT SENSE SHUNT RESISTOR CIRCUIT

CROSS-REFERENCE TO RELATED APPLICATION

This is divisional application claims priority of U.S. patent application Ser. No. 10/625,029, filed Jul. 22, 2003 now abondoned in the name of Massimo Grasso et al., and entitled "CURRENT SENSE SHUNT RESISTOR CIRCUIT".

BACKGROUND OF THE INVENTION

1. Field of the Invention

The present invention relates generally to sensing output current in an electrical circuit. The present invention relates more particularly to a shunt resistor connected to an electrical circuit output to measure the current of the output.

2. Description of Related Art

A number of electrical applications, in particular power applications, take advantage of output current sensing to provide feedback control for the electrical circuit or system. Typically, the output current is sensed by measuring a voltage drop across a highly precise resistance to thereby determine the current flowing through the resistance related to the measured voltage drop. Because this technique inherently requires a voltage drop, there is often a large amount of power dissipated in the resistance with large current flows. Indeed, because power equals the resistance times the current squared, increasing current determines an increase in power dissipation proportional to the square of the current.

To solve this difficulty, the precise resistance is employed as a shunt resistance that is as low as possible to reduce power dissipation. However, when the shunt resistance is reduced, the measurable voltage drop across the shunt resistance decreases as well. As a result, the dynamic range of the measurable voltage drop decreases significantly. With the limited dynamic range resulting from the lowered shunt resistance, the accuracy and precision of voltage measurements is degraded.

As an example, a typical shunt resistance is composed of manganin, which is suitable for use in high current applications where current sensing is desired. Typical characteristics of commonly used manganin shunts are provided in Table 1 below.

TABLE 1

Manganin shunt characteristics

| Parameter | Value | Unit | Symbol |
|---|---|---|---|
| Thermal Coefficient | ~50 | ppm/° C. | $\alpha_m$ |
| Resistance | 0.3 and up | mΩ | R |
| Precision | 1 | % | — |
| Thermal resistance | 15 | ° C./W | $R_{th}$ |
| Maximum power dissipation | 5 | W | $P_{max}$ |

A review of the data in Table 1 reveals several useful conclusions regarding the use of low resistance manganin shunts. For example, the thermal resistance of the shunt is fairly high causing an increase in shunt temperatures due to heat and resistance power dissipation. For example, with a 2 mΩ shunt in an application calling for the measurement of a 50 A output, the change in temperature due to the thermal resistance is given by the following equation.

$$\Delta T = 2\ m\Omega \cdot (50\ A)^2 \cdot 15°\ C./W = +75°\ C.$$

The maximum allowable power dissipation permitted by the manganin shunt limits the maximum dynamic voltage range as current through the shunt increases. Accordingly, in the higher range of measured current there is a loss of precision in reading the voltage drop across the shunt.

Given a typical power dissipation through the manganin shunt of 5 W, the shunt resistance varies among different measured current output applications. A summary of output current, shunt resistance and dynamic voltage range for the shunt is provided in Table 2 below.

TABLE 2

Voltage dynamic across a resistive shunt

| Max Current | Shunt R | Dynamic | Power |
|---|---|---|---|
| ±50 A | 2 mOhm | ±100 mV | 5 W |
| ±100 A | 0.5 mOhm | ±50 mV | 5 W |
| ±150 A | 0.22 mOhm | ±33 mV | 5 W |
| ±200 A | 0.13 mOhm | ±25 mV | 5 W |

The data from Table 2 indicates that as the application current increases, the dynamic range available through the appropriately sized shunt resistor decreases. The measurable quantities of changing voltage related to current are thus reduced in higher current applications, making accurate current measurement problematic.

Accordingly, there is a need for a current sensing circuit for use with high current applications with a dynamic range more useful for precision measurements.

SUMMARY OF THE INVENTION

According to the present invention, a shunt circuit for sensing current in an electrical circuit output with an increased dynamic range is provided. The shunt circuit provides a resistor in parallel with the shunt resistance to obtain a current divider. The parallel resistor acts as a current sense resistor with a gain in relation to the shunt resistor that can be chosen to obtain a preferred value for a current sensing dynamic range.

A compensation circuit is connected to the current sense resistor to compensate for temperature variations over a broad range of current output values. According to one embodiment, the compensation circuit is adjusted in a setup phase for the specifics of the application, and then placed in sensing mode to obtain current sense measurements. According to another embodiment, a dynamic range for a given precision is calculated and applied by adjusting circuit parameters in a setup phase. According to another embodiment of the present invention, a configuration for calculating permanent settings of circuit components to obtain a desired gain and precision is provided.

The current sensing shunt resistor circuit according to the present invention is configured to be substantially independent of thermal variations and changes in dynamic thermal ranges. The current sense shunt resistor circuit can be implemented on an integrated circuit with standard IC processes to further improve power dissipation characteristics. In addition, circuit component values can be set permanently, or changed dynamically through electronic programming.

Other features and advantages of the present invention will become apparent from the following description of the invention which refers to the accompanying drawings.

DETAILED DESCRIPTION OF THE PREFERRED EMBODIMENTS

Figure 1:
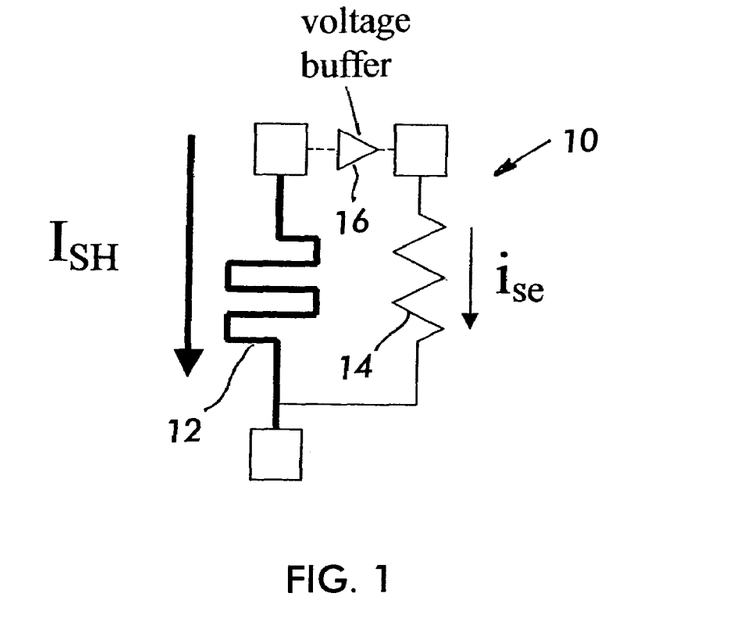
FIG. 1 is a schematic overview of the current sense shunt resistor circuit according to the present invention.

Referring now to FIG. 1, the current sense and shunt resistor circuit is shown generally as sensing circuit 10. Circuit 10 includes a current shunt 12 through which current flows, thereby providing a voltage across shunt 12. Circuit 10 also includes a voltage buffer 16 to control current between the two parallel shunt paths. Disregarding voltage buffer 16 for the moment, circuit 10 is in the form of a current divider that provides two parallel paths for shunt current, including a path through a sensing resistor 14. By making sense resistor 14 have the same voltage as shunt resistor 12, sense resistor current $i_{se}$ is determined according to the following equation.

$$i_{se} \cdot I_{SH} \cdot \frac{R_{SH0}}{R_{se0}} = \frac{I_{SH}}{G} \quad (1)$$

In equation 1, $i_{se}$, is the sense resistor current, $I_{SH}$ is the shunt resistor current, $R_{SH}$ is the shunt resistor resistance value, $R_{se}$ is the sense resistor resistance value and G is the gain ratio determined by the values of the shunt and sense resistors. Circuit 10 can be arranged and operated so that a value for G can be chosen to obtain a fixed value for a dynamic range of operation for current $i_{se}$. Current $i_{se}$ can be measured as an output of circuit 10 to obtain a wide range of current sensing with sufficient precision to permit the use of circuit 10 in a wide variety of applications.

Figure 2:
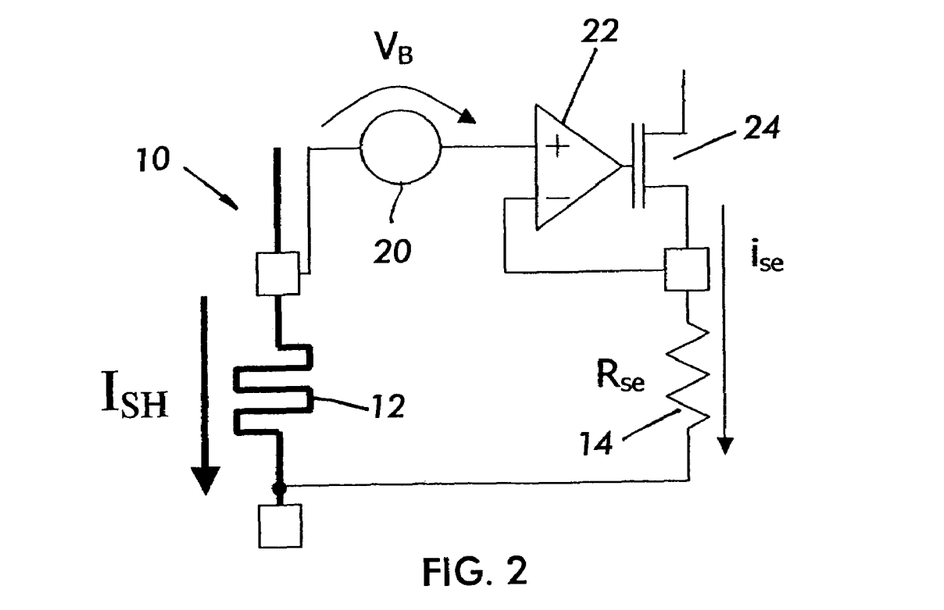
FIG. 2 is a circuit diagram illustrating functionality of the current sense shunt resistor circuit according to the present invention.

Referring now to FIG. 2, voltage buffer 16 is shown as a biasing voltage 20 and an operational amplifier 22 coupled to a MOS-gated transistor 24. The components making up voltage buffer 16 permit current $i_{se}$ to be positive in sign across sense resistor 14. Since current $I_{SH}$ in shunt resistor 12 can change sign, biasing voltage 20 maintains current $i_{se}$ in the positive direction to bound the sense current in a positive range as referenced. With this biasing voltage, the equation describing current $i_{se}$ changes.

$$i_{se} = \frac{V_B}{R_{se}} + I_{SH} \cdot \frac{R_{SH}}{R_{se}} \quad (2)$$

From equation 2, it can be observed that $i_{se}$ is related to the biasing voltage $V_B$ (20), the sensing resistor $R_{se}$ (14) and the ratio of the shunt resistor $R_{SH}$ (12) and the sensing resistor $R_{se}$ (14). The ratio of shunt resistor 12 to sensing resistor 14 dictates the gain between the shunt current $I_{SH}$ and the sense current $i_{se}$. That is, $R_{SH}/R_{se}=1/G$. In equation 2, sensing resistor 14 has a thermal coefficient that is set as close as possible to shunt resistor 12 to obtain appropriate compensation. In addition, if the term of equation 2 that includes biasing voltage $V_B$ can be compensated, or removed, then equation 2 becomes equation 1.

It is well known that resistor power dissipation is limited for practical resistors, and that temperature of resistors increases with increased current flow due to high thermal resistance as well as pure electrical resistance and the associate heat that is generated. Accordingly, as the temperature of circuit 10 increases, the changing range of measurement for the shunt and sense resistors must be compensated to obtain an unchanging and useful dynamic range of current sensing. The relationship between the sense current $i_{se}$ and temperature is illustrated below, in which equation 1 is rewritten to incorporate thermal resistance factors in terms of resistor characteristics and changes in temperature.

$$i_{se} = I_{SH} \frac{R_{SH0}(1 + \alpha_2 \cdot \Delta T)}{R_{se0}(1 + \alpha_1 \cdot \Delta T)} \cong \frac{I_{SH}}{G}(1 + ITC \cdot \Delta T) \quad (3)$$

In equation 3, $R_{SH0}$ and $R_{se0}$ represent the values of $R_{SH}$ and $R_{se}$ at 25° C. The thermal coefficients of the resistors are represented as $\alpha_1$ and $\alpha_2$, of the sense and shunt resistors, respectively. The term ITC represents the current temperature coefficient for the combination of shunt and sense resistors in equation 3, with the approximation being made according to the conventions of equations 1 and 2.

If the approximation in equation 3 is made to be equal, the ITC term can be resolved in terms of the temperature coefficients of the shunt and sense resistor.

$$\frac{(1 + \alpha_2 \cdot \Delta T)}{(1 + \alpha_1 \cdot \Delta T)} \equiv 1 + ITC \cdot \Delta T \Rightarrow ITC = \frac{\alpha_2 \cdot (\rho - 1)}{1 + \frac{\alpha_2}{\rho} \cdot \Delta T} \quad (4)$$

The representation of ITC includes the ratio of the thermal coefficients, $\rho = \alpha_1/\alpha_2$, which represents the mismatch between the shunt and sense resistors. The thermal coefficients can be determined for the resistors, although only approximately. For example, $\alpha_2$ is approximately equal to 4200 ppm when shunt resistor $R_{SH}$ (12) is made of aluminum.

Figure 3:
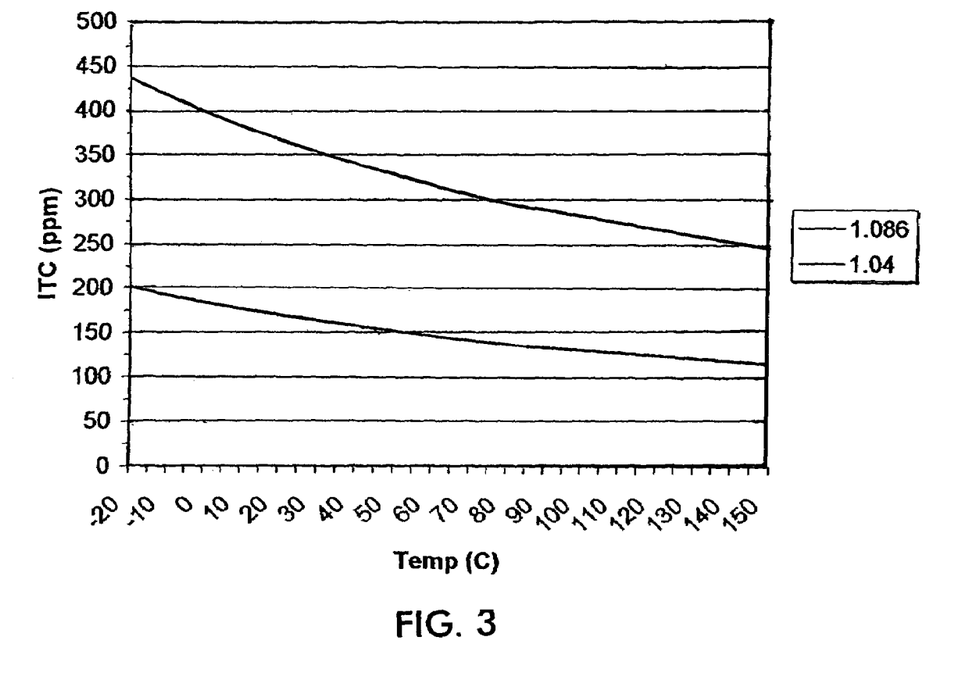
FIG. 3 is a graph of current temperature coefficient versus temperature for the current sense shunt resistor circuit according to the present invention.

An analysis of equation 4 shows that the current temperature coefficient ITC is non-linear over temperature. Referring to FIG. 3, a graph is provided illustrating ITC for two different metal resistors prepared in an integrated circuit process. One integrated circuit process for forming a resistor using a two metal composition with thicknesses of 20 micrometers and 0.6 micrometers, and with thicknesses of 20 micrometers and 1.2 micrometers, produced resistors with thermal coefficient ratio values of $\rho=1.086$ and $\rho=1.04$. FIG. 3 illustrates the plots of these two resistors thus obtained, with a gain value of G=100,000, so that the ratio of $i_{se}/I_{SH}=10$ μA/A.

In viewing the results illustrated in FIG. 3, it becomes clear that (1) ITC decreases with temperature, and (2) ITC is non-linear over temperature, i.e., ITC is a function of temperature. As the ratio of thermal coefficients $\rho$ approaches 1, the sensed current values become less temperature dependent and more linear. This is the case, even if a strongly temperature dependent material is used to form the shunt and sense resistors 12, 14. Accordingly, by providing the sense resistor in combination with the shunt resistor, and adjusting the ratio of the thermal coefficients between the two resistors, compensation can be provided to obtain a linear current sense with a wide dynamic range, an important feature of the present invention.

Biasing voltage $V_B$ (20) is introduced to maintain the sense current $i_{se}$ in a positive direction. Equation 2 illustrates the introduction of the biasing voltage with the biasing term $V_B/R_{se}$. This biasing term introduces an error that changes as a function of temperature. A robust design for obtaining linear results for a sense current over temperature depends upon compensating this biasing term.

The reason the biasing $V_B/R_{se}$ is dependent on temperature is because of the temperature coefficient $\alpha_1$, which includes consideration of changes in resistance over temperature. The resistance value of $R_{se}$ is proportional to temperature, which indicates that the ratio of $V_B/R_{se}$ is hyperbolic with regard to temperature. The term $V_B/R_{se}$ can be canceled from equation 2 using a number of techniques, one exemplary technique being presented below. It should be recognized that the present invention contemplates a number of possible solutions to cancel this term from equation 2, based on the knowledge of the term as described above.

Figure 4:
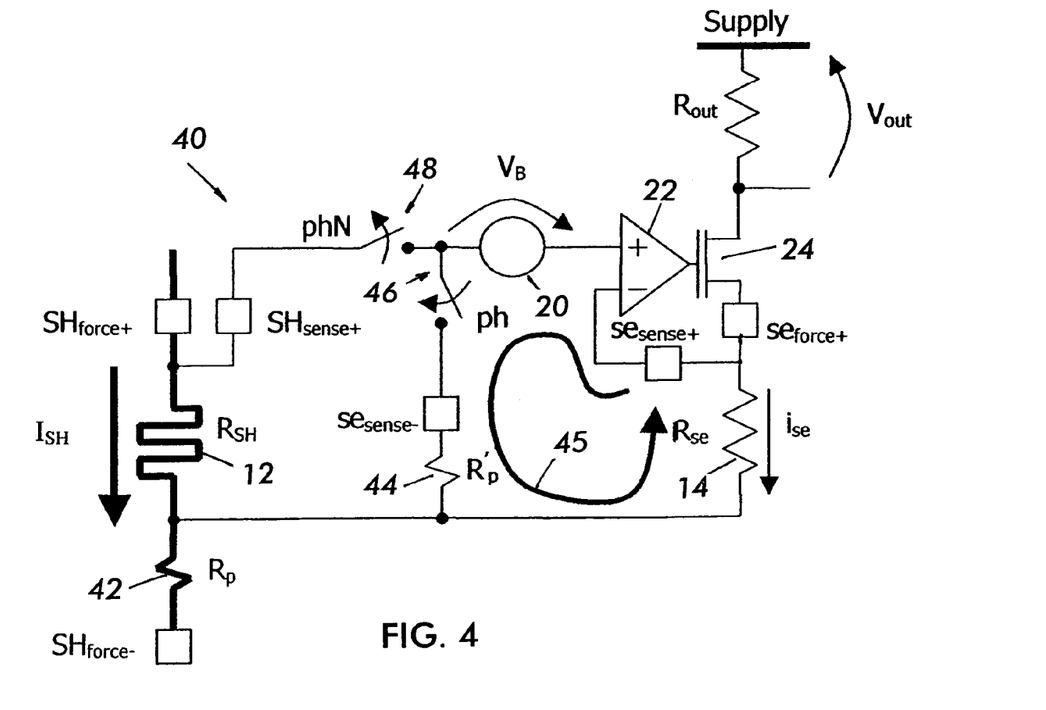
FIG. 4 is a circuit diagram of an embodiment according to the present invention.

Referring now to FIG. 4, a diagram of a circuit useful for applying a method to cancel the $V_B/R_{se}$ term from equation 2 is shown generally as circuit 40. Circuit 40 more closely models the actual operating parameters of the shunt current sense circuit, with the inclusion of parasitic resistances $R_p$ (42) and $R'_p$ (44). In addition, two switches, ph (46) and phN (48) are provided to connect or disconnect the various circuit sections. Circuit 40 is first analyzed by solving for sense current $i_{se}$ in the loop indicated by arrow 45, with switch 46 closed and switch 48 open. In this condition, sense current $i_{se}$ can be written according to the following equation.

$$i_{se} = \frac{V_B}{R_{se}} + \frac{i_B \cdot R'_p}{R_{se}} = \frac{V_B}{R_{se}} + \varepsilon \quad (5)$$

The current $i_B$ in equation 5 represents a current flowing in correspondence with the biasing voltage $V_B$ while switch 46 is on and switch 48 is off. While equation 5 holds for the circuit, a voltage loop indicated by arrow 45 permits an independent value for current $i_{se}$ to be determined and stored as a base value (i.e., a reference current). When switches 46, 48 are reversed, so that switch 46 is off and switch 48 is on, the circuit becomes approximately the same as that indicated in FIG. 2, and equation 2 describes the resulting circuit operation. Accordingly, using the initially determined sense current $i_{se}$ as a base value (i.e., reference current), equation 5 can be subtracted from equation 2 to obtain a description of the operation of the resulting circuit 40.

$$i_{se} = \frac{V_B}{R_{se}} + I_{SH} \cdot \frac{R_{SH}}{R_{se}} - \frac{V_B}{R_{se}} - \varepsilon = I_{SH} \cdot \frac{R_{SH}}{R_{se}} - \varepsilon \quad (6)$$

The error term $\varepsilon$ is a current value that is extremely small and negligible with regard to most applications. For example, if current $i_B$ equals 25 µA, $R'_p$ equals 10 mΩ and $R_{se}$ equals 29Ω, $\varepsilon$ is equal to approximately 0.008 µA. That is, over the range of operation, if current $I_{SH}$ equals 1 amp, which would imply that current $i_{se}$ equals 10 µA, then $\varepsilon$ as a percentage is equal to 0.008 µA/10 µA sensed, or about 0.08%. In addition, it is possible to read a value for current $i_{se}$ using circuit 40 by measuring the voltage, $V_{out}$ across the supply resistor $R_{out}$.

Using the above technique accompanied with the switching action in circuit 40, the term $V_B/R_{se}$ can be cancelled from equation 2, with only a negligible error factor present in the resulting sensed current $i_{se}$. The switching circuit, biasing voltage, storage element for storing the base value (i.e., reference current), summing element for performing equation 6 (i.e., subtracting the base value from the sensed current $i_{se}$ as expressed in equation 2), and other components used to obtain the result of equation 6 can be realized individually on a separate current sensing IC.

Figure 5:
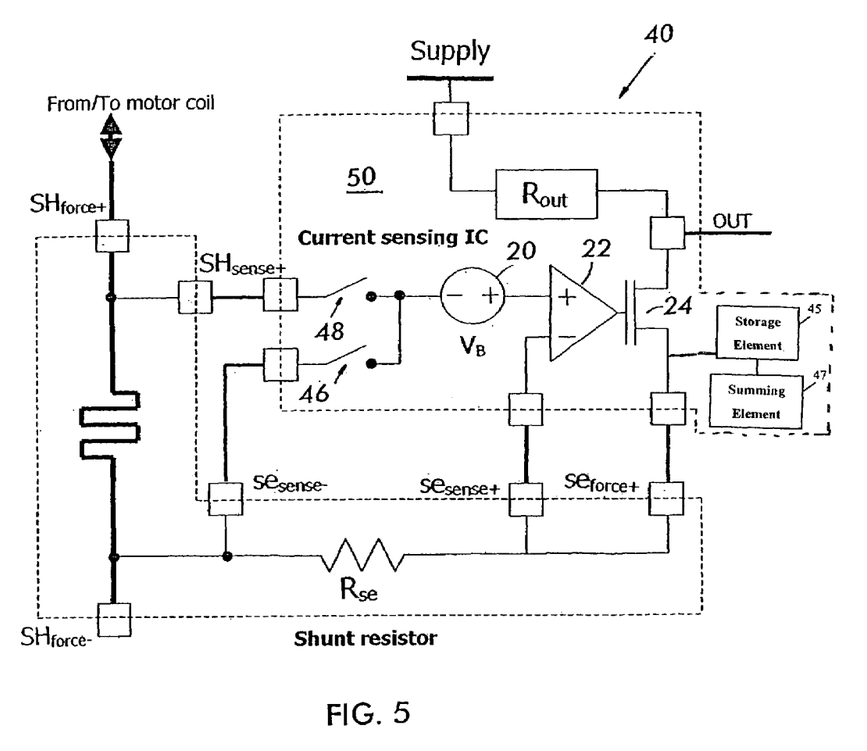
FIG. 5 is a circuit diagram illustrating the current sensing shunt resistor circuit according to the present invention implemented as an IC with external connections.

Referring now to FIG. 5, current sensing IC 50 is illustrated in dashed lines as encompassing switches 46 and 48, biasing voltage $V_B$, op-amp 22, MOS-gated transistor 24, supply resistor $R_{out}$, storage element 45, and summing element 47. The external connections to current sensing IC 50 are shown for connection to the shunt and sense resistors to obtain the overall current sense circuit 40.

Precise ratios between $R_{se}$ and $R_{SH}$ are usually required by users (less than or equal to 1%). Linearity of current sensing is not necessarily effected by a mismatch of $R_{se}$ and $R_{SH}$, if this mismatch is fixed. To obtain these precise relationships, the resistors $R_{SH}$ and $R_{se}$ are trimmed according to a particular trimming method. For example, a current is applied to the shunt resistor $R_{SH}$ and the sense resistor $R_{se}$ with the goal of obtaining a current divider with a gain of G equals 100.000±1%.

The highly precise and accurate gain value is obtained by comparing the current through the two different resistors with respect to the desired gain of the resistor ratio value. The following equation provides a percentage error obtained through direct measurements that indicates the appropriate changes made to the resistor trimming mechanism to obtain the desired gain. Because the equation takes into account the nominal current through the shunt resistor, the gain error is sensitive to the range of operation for the particular current sensing application.

$$\% \text{ error} = \frac{I_{se\ meas} - \frac{I_{nom}}{G}}{\frac{I_{nom}}{G}} \% \quad (7)$$

Equation 7 uses a nominal current forced through the shunt resistor of $I_{nom}$, for comparison with the current forced through the sense resistor, $I_{se\ meas}$. The percentage error obtained by equation 7 indicates how the sense resistor can be changed to achieve a highly precise and accurate gain after trimming.

Figure 6:
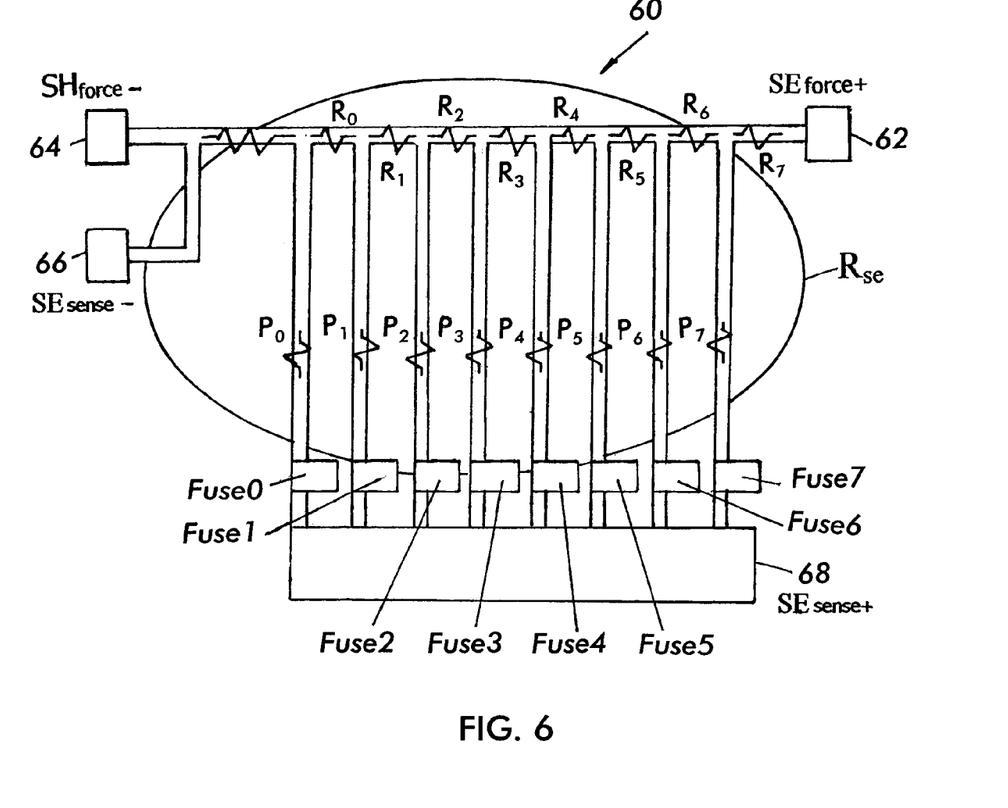
FIG. 6 is an illustration of a resistor network that can be configured to provide a desired gain precision for the current sensing shunt resistor circuit according to the present invention.

One trimming mechanism that can be used according to this method is to supply an array of resistors that comprise sense resistor $R_{se}$. Such an array is illustrated in FIG. 6 as network 60. A number of fuses, fuse 0–fuse 7, are supplied to permit or prevent conduction down various branches of network 60 to change the resistance of the overall sense resistor $R_{se}$. In accordance with an embodiment of the method of the present invention, a current is forced through shunt resistor $R_{SH}$ leading to a forced current supplied through pins 62 and 64 in FIG. 6. A look-up table is provided according to the measured sense current $I_{se\ meas}$, so that an error percentage can be determined according to equation 7 to indicate which of fuses 0–7 should be blown to obtain the appropriate resistance value for sense resistor $R_{se}$.

For example, if a nominal current of one amp is applied through shunt resistor $R_{SH}$, the ratio of $I_{nom}/G=10$ µA. If current $I_{se\ meas}$ is measured at 9.28 µA, the resulting error percentage is −7.20%. Referring to Table 3 below, a value for the error percentage identifies a corresponding fuse configuration that will achieve the desired accuracy and precision in the gain between the two resistors.

TABLE 3

| $\frac{I_{se\ meas} - I_{nom}/G}{I_{nom}/G}\%$ | Fuse configuration MSB to LSB | Residual error |
|---|---|---|
| ... | ... | ... |
| −7.50% | 11100100 | −0.22% |
| −7.40% | 11100100 | −0.11% |
| −7.30% | 11100100 | 0.00% |
| −7.20% | 00101000 | 0.06% |
| −7.10% | 11000100 | −0.01% |
| −7.00% | 11000100 | 0.10% |

In the above example, the measured error percentage of −7.20% provides a fuse configuration identified as 00101000, which can also be viewed as a bit configuration, to indicate that fuse 3 and fuse 5 should be blown. Once fuse 3 and fuse 5 have been blown according to any particular method, the resulting sense resistor $R_{se}$ should provide a highly precise and accurate gain as desired for a nominal current of 1 A in shunt resistor $R_{SH}$. In accordance with the contents of the trimming look-up Table 3, the residual error for the newly determined gain should be approximately 0.06%, which should supply the resulting gain of 100.000±1%.

The look-up table exemplified by Table 3 is derived from solving the circuit equations of the trimming resistor network 60. A number of techniques are available to obtain this look-up table, including computer programs and rote circuit analysis calculations. The resulting trimming look-up table provides combinations of fuse interruptions that produce a resulting voltage output on pin 66 in FIG. 6, for example, for a given current. The program to calculate the various combinations of fuse interruptions and the resulting changes in sensed output uses the resistor values for $R_{SH}$ and $R_{se}$, as well as the values of the resistors $R_1$–$R_7$ illustrated in FIG. 6, for example, and the various paths $P_0$—$P_7$ that connect the resistors $R_0$–$R_7$ with the trimming fuses fuse 0–fuse 7. The labels for the circuit points in FIG. 6 correspond to those provided in FIG. 4, for example. In addition to calculating the various resulting error percentages based on blown fuse combinations, the program calculates the residual error differences between the target values and the desired value after choosing the fuse configuration that minimizes the residual error difference.

According to the method of the exemplary embodiment, a trimming procedure is accomplished as follows. First, a nominal current $I_{nom}$ is forced in shunt resistor $R_{SH}$. The current in sense resistor $R_{se}$ is measured to obtain the value for $I_{se\ meas}$. The error percentage ratio in equation 7 is calculated using the values for the nominal current and the measured sense current, together with the ratio of the sense and shunt resistor values. The resulting error percentage is used to identify the entry in the lookup table, e.g., Table 3 that corresponds to the appropriate fuse configuration. The appropriate fuses indicated in the values in Table 3 are blown to obtain the desired value for the sense resistor $R_{se}$, and the error percentage is calculated to obtain the residual error that should be less than or equal to that illustrated in the third column of Table 3.

Using the resistor network 60 illustrated in FIG. 6, it is possible to use the above-described procedure to trim resistor values with an initial ±24% mismatch to within ±1%.

The low ohmic shunt resistor discussed above provides a precise and accurate solution for measuring current in high current applications that typically involve common shunt resistors. A scalable dynamic range sense current is obtained that is independent of the shunt resistor value. The circuit described provides good thermal coefficient properties to obtain a more linear current measurement over a range of temperature and current values. By packaging the sensing and control mechanism in a single IC, for example, typical IC heat and power dissipation mechanisms can be used to further lower thermal resistance and improve current sensing operation. By providing a technique for trimming the sense resistor, which can be accomplished electronically, a gain precision of better than 1% can be obtained. It should be noted that the trimming mechanism for the sense resistor can be accomplished in any number of methods, including through the provision of an automatic trimming circuit that can produce a forced current, measure sensed current, calculate error percentages and automatically blow specific fuses in a resistor network to obtain a highly precise sense resistor value in comparison with overall circuit operation.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A current sense circuit, comprising:
   a shunt resistor in a wire for measuring current through the wire, the shunt resistor having first and second ends;
   a sense resistor having a first end and a second end, which is in connection with the second end of the shunt resistor;
   a transistor intended to be coupled to a supply and having a drain coupled to the first end of the sense resistor and having a gate;
   an amplifier having an output coupled to the gate of the transistor and an input in connection with the first end of the shunt resistor;
   a biasing voltage coupled to the input of the amplifier, the biasing voltage causing a reference current to continuously flow through the sense resistor;
   a switch coupled between the first end of the shunt resistor and the biasing voltage for coupling and decoupling a voltage across the shunt resistor to and from the input of the amplifier; and
   wherein when the switch is operated to couple the shunt resistor voltage to the amplifier, an increased current, beyond the reference current, flows through the sense resistor.

2. The circuit according to claim 1, wherein when the switch is operated to decouple the shunt resistor voltage from the amplifier, the circuit is operable such that the biasing voltage continues to cause the reference current to flow through the sense resistor.

3. The circuit according to claim 2, further comprising a storage element in connection with the sense resistor for storing a value indicative of the reference current flowing through the sense resistor when the switch is operated to decouple the shunt resistor voltage from the amplifier.

4. The circuit according to claim 3, further comprising a summing element coupled to the storage element and operable to subtract the reference current value stored in the storage element from a sensed current value that is indicative of the current flowing through the sense resistor when the switch is operated to couple the shunt resistor voltage to the amplifier.

5. The circuit according to claim 4, wherein a value of the shunt resistor and a value of the sense resistor establish a gain relationship such that the current through the wire is a function of the gain relationship and the difference between the sensed current value and the reference current value.

6. The circuit according to claim 1, wherein at least the transistor, the amplifier, the biasing voltage, and the switch are an integrated circuit.

7. The circuit according to claim 2, further comprising:
a second switch operable to couple and decouple the second end of the sense resistor to and from the biasing voltage;
wherein when the shunt resistor voltage is coupled to the amplifier, the second switch is operated to decouple the sense resistor from the biasing voltage; and
wherein when the shunt resistor voltage is decoupled from the amplifier, the second switch is operated to couple the sense resistor to the biasing voltage such that the biasing voltage continues to cause the reference current to flow through the sense resistor.

8. The circuit according to claim 1, wherein the biasing voltage maintains a constant current direction through the sense resistor.

9. The circuit according to claim 1, wherein at least one of the shunt and sense resistors is selected to obtain a ratio of thermal coefficients for the resistors that is approximately 1.

10. A current sensing integrated circuit for connection to a sense resistor and to a shunt resistor each having second ends that are in connection, the shunt resistor being in a wire for measuring current through the wire, the circuit comprising:
a transistor having a source to be coupled to a supply, a drain to be coupled to a first end of the sense resistor, and a gate;
an amplifier having an output coupled to the gate of the transistor, and an input;
a biasing voltage coupled to the input of the amplifier, the biasing voltage intended to continuously cause a reference current to flow through the sense resistor; and
a switch having a first end coupled to the biasing voltage and a second end to be coupled to the shunt resistor, the switch being operable to couple and decouple a voltage across the shunt resistor to and from the input of the amplifier; and
wherein when the switch is operated to couple the shunt resistor voltage to the amplifier, the integrated circuit is intended to cause an increased current, beyond the reference current, to flow through the sense resistor.

11. The circuit according to claim 10, wherein whether the switch is operated to couple or decouple the shunt resistor voltage to and from the amplifier, the integrated circuit is configurable such that the biasing voltage can continue to cause the reference current to flow through the sense resistor.

12. The circuit according to claim 11, further comprising a storage element in connection with the transistor and intended for storing a value indicative of the reference current flowing through the sense resistor when the switch is operated to decouple the shunt resistor voltage from the amplifier.

13. The circuit according to claim 12, further comprising a summing element coupled to the storage element and operable to subtract the reference current value stored in the storage element from a sensed current value that is indicative of the current flowing through the sense resistor when the switch is operated to couple the shunt resistor voltage to the amplifier.

14. The circuit according to claim 11, further comprising
a second switch having a first end coupled to the biasing voltage and a second end to be coupled to the second end of the sense resistor, the switch being operable to couple and decouple the sense resistor to and from the biasing voltage;
wherein when the shunt resistor voltage is coupled to the amplifier, the second switch is operable to decouple the sense resistor from the biasing voltage; and
wherein when the shunt resistor voltage is decoupled from the amplifier, the second switch is operable to couple the sense resistor to the biasing voltage such that the biasing voltage can continue to cause the reference current to flow through the sense resistor.

15. The circuit according to claim 11, wherein the biasing voltage is intended to maintain a constant current direction through the sense resistor.

16. A method for measuring current in a wire, comprising:
providing a shunt resistor in the wire for measuring the current through the wire, the shunt resistor having first and second ends;
providing a sense resistor with first and second ends, the second ends of the sense and shunt resistors being in connection;
providing a transistor having a gate, a source coupled to a supply, and a drain coupled to the first end of the sense resistor;
providing an amplifier having an output coupled to the gate of the transistor and having an input;
applying a biasing voltage to the input of the amplifier, thereby causing a reference current to continuously flow through the sense resistor;
providing a switch between the first end of the shunt resistor and the biasing voltage for coupling and decoupling a voltage across the shunt resistor to and from the input of the amplifier,
operating the switch to decouple the shunt resistor voltage from the amplifier; and
obtaining a value indicative of the reference current flowing through the sense resistor.

17. The method according to claim 16, wherein said obtaining step comprises storing the reference current value.

18. The method according to claim 16, further comprising the steps of:
operating the switch to couple the shunt resistor voltage to the amplifier thereby causing an increased current, beyond the reference current, to flow through the sense resistor; and
subtracting the reference current value from a sensed current value that is indicative of the increased current flowing through the sense resistor.

19. The method according to claim 18, wherein a value of the shunt resistor and a value of the sense resistor establish a gain relationship such that the current through the wire is a function of the gain relationship and the difference between the sensed current value and the reference current value.

* * * * *